United States Patent [19]
Ogura et al.

[11] Patent Number: 6,166,560
[45] Date of Patent: *Dec. 26, 2000

[54] BASIC CELL STRUCTURE HAVING A PLURALITY OF TRANSISTORS FOR MASTER SLICE TYPE SEMICONDUCTOR INTEGRATED CIRCUIT DEVICE

[75] Inventors: Isao Ogura; Yoshitaka Ueda, both of Ogaki, Japan

[73] Assignee: Sanyo Electric Co., Ltd., Osaka, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/926,625

[22] Filed: Sep. 8, 1997

[30] Foreign Application Priority Data

Sep. 9, 1996 [JP] Japan .................................. 8-237969
Aug. 4, 1997 [JP] Japan .................................. 9-209272

[51] Int. Cl.⁷ .......................... H01L 25/00; H01L 27/10; H03K 19/177

[52] U.S. Cl. ............................................. 326/41; 257/206

[58] Field of Search ............................ 326/41, 101, 102, 326/103; 257/206, 204, 205, 369; 364/490

[56] References Cited

U.S. PATENT DOCUMENTS

| | | | |
|---|---|---|---|
| 4,490,440 | 12/1984 | Reber | 428/620 |
| 4,692,783 | 9/1987 | Monma et al. | 257/206 |
| 4,816,887 | 3/1989 | Sato | 257/206 |
| 4,884,115 | 11/1989 | Michel et al. | 257/206 X |
| 5,055,716 | 10/1991 | El Gamel | 326/42 |
| 5,068,548 | 11/1991 | El Gamel | 326/58 |
| 5,289,021 | 2/1994 | El Gamel | 257/206 |
| 5,341,041 | 8/1994 | El Gamel | 326/44 |

FOREIGN PATENT DOCUMENTS

| | | |
|---|---|---|
| 61-168954 | 7/1986 | Japan . |
| 63-314847 | 12/1988 | Japan . |
| 2-181949 | 7/1990 | Japan . |
| 3-8357 | 1/1991 | Japan . |
| 4-10468 | 1/1992 | Japan . |
| 5-63046 | 3/1993 | Japan . |
| 5-299508 | 11/1993 | Japan . |
| 6-501813 | 2/1994 | Japan . |

*Primary Examiner*—Patrick Wamsley
*Attorney, Agent, or Firm*—Sheridan Ross P.C.

[57] ABSTRACT

A basic cell has a plurality of transistors that are separated from one another for forming an electronic circuit that has a particular function when the transistors are coupled. The basic cell has at least two transistors. One is different in size and orientation from the other.

32 Claims, 15 Drawing Sheets

BASIC CELL STRUCTURE HAVING A PLURALITY OF TRANSISTORS FOR MASTER SLICE TYPE SEMICONDUCTOR INTEGRATED CIRCUIT DEVICE

BACKGROUND OF THE INVENTION

The present invention relates generally to a master slice system semiconductor integrated circuit device and the structure of a basic cell constituting the same.

Master slice systems are well known for standardizing a process from the design of an LSI to impurity diffusion, and only the subsequent circuit interconnection is carried out type by type in order to promptly meet various demands. This master slice system has advantages in that it yields small quantities of multiple types of products, shortens the development period and reduces the development costs.

A master slice type semiconductor integrated circuit (IC) device is produced by connecting a plurality of basic cells arranged in a matrix form or in one direction in accordance with the specifications of a completed article.

FIG. 16 shows the structure of an ordinary basic cell 100 mounted on a master slice type semiconductor IC device as described in, for example, Japanese Unexamined Patent Publication No. Hei 5-63046. This basic cell 100 comprises gate electrodes 101 and 102 of P type MOS transistors, a P type impurity diffusion region 103 equivalent to the drain terminal or source terminal of a P type MOS transistor, gate electrodes 104 and 105 of N type MOS transistors, an N type impurity diffusion region 106 equivalent to the drain terminal or source terminal of an N type MOS transistor, and two power supply lines 107 and 108.

FIG. 17 is a circuit diagram showing a delayed flip-flop circuit (hereinafter called "DFF circuit") 109 which is used as, for example, one memory element of a register.

In the figure, a DFF circuit 109 includes two stages of latch circuits 113 and 117 and a clock circuit 120. The latch circuit 113 has an inverter 110, a NAND gate 111 and a transfer gate 112. The latch circuit 117 has an inverter 114, a NAND gate 115 and a transfer gate 116. A signal Q and its inverted signal QN are output from the latch circuit 117 at the last stage. Transfer gates 118 and 119 connect or disconnect between an input terminal D and the latch circuit 113 and between the latch circuit 113 and the latch circuit 117, respectively. The individual transfer gates 112, 116, 118 and 119 are opened or closed by clock signals CK2 and CKN from a clock circuit 120. The clock circuit 120 is constructed by connecting two stages of inverters 121 and 122, and the clock circuit 120 outputs the clock signal CK2 and its inverted signal CKN.

The conventional basic cell 100 shown in FIG. 16 is suitable for producing a circuit with fewer elements, such as an inverter or a 2-input NAND or NOR gate. However, various problems arise in designing cells with a large chip-occupying area and multiple elements, such as a cell with plural types of circuits including latch circuits, transfer gates and inverters, as in the DFF circuit 109 shown in FIG. 17, a composite gate cell or a high drive-performance cell.

For example, the transfer gates 112, 116, 118 and 119 and the clock circuit 120, which need only a relatively small drive performance, and the output circuit (the inverter 114 and the NAND gate 115), which requires a large drive performance, are included in the DFF circuit 109 shown in FIG. 17. With the structure of the conventional basic cell 100, all the transistors are the same in size. Therefore, many transistors should be connected in parallel in constructing the output circuit if the transistors in the basic cell 100 are set to sizes that can cope with a transfer gate or a clock circuit. This increases the cell area, resulting in an increased chip area.

If the transistors in the basic cell 100 are set to sizes that can cope with the output circuit, large-size transistors should be used for a transfer gate or a clock circuit, both of which inherently require small-size transistors. This, again, inevitably increases the cell area.

FIG. 18 shows an example in which the DFF circuit 109 shown in FIG. 17 is designed by arranging eight basic cells 100 horizontally and connecting their associated terminals.

If large-size transistors are used for a transfer gate or a clock circuit, both of which should inherently be designed with small-size transistors, the input capacity is increased, which requires an external circuit having a high drive performance. This increases power consumption.

Since the conventional structure is made by combining multiple basic cells with simple structures, there is an increased chance of connecting circuits over transistors. This inevitably reduces the contact regions between the transistors and the circuit interconnection and increases contact resistances with the drains and sources. As a result, the drive performances of the individual transistors are reduced and it becomes necessary to add transistors to compensate for the lowered performance. This results in complicated circuit interconnections and an increased cell area.

SUMMARY OF THE INVENTION

It is the primary objective of this invention to provide a basic cell with a reduced cell area. It is the secondary objective of this invention to provide semiconductor devices, such as a flip-flop circuit, an exclusive OR gate, a multiplexer and an adder, which overcome the above-discussed problems by using the basic cell of the first objective.

A basic cell according to this invention has a plurality of transistors separated by a predetermined distance for forming an electronic circuit having a predetermined function by coupling the transistors. The transistors of the basic cell include a first transistor and a second transistor different from the first transistor in size and orientation. A flip-flop circuit, an exclusive OR gate, a multiplexer or an adder is formed by using at least one basic cell.

Other aspects and advantages of the invention will become apparent from the following description, taken in conjunction with the accompanying drawings, illustrating by way of example the principles of the invention.

BRIEF DESCRIPTION OF THE DRAWINGS

The invention, together with objects and advantages thereof, may best be understood by reference to the following description of the presently preferred embodiments together with the accompanying drawings.

DETAILED DESCRIPTION OF THE PREFERRED EMBODIMENTS

First Embodiment

The first embodiment of the present invention will now be described with reference to FIGS. 1 through 5.

Figure 1:
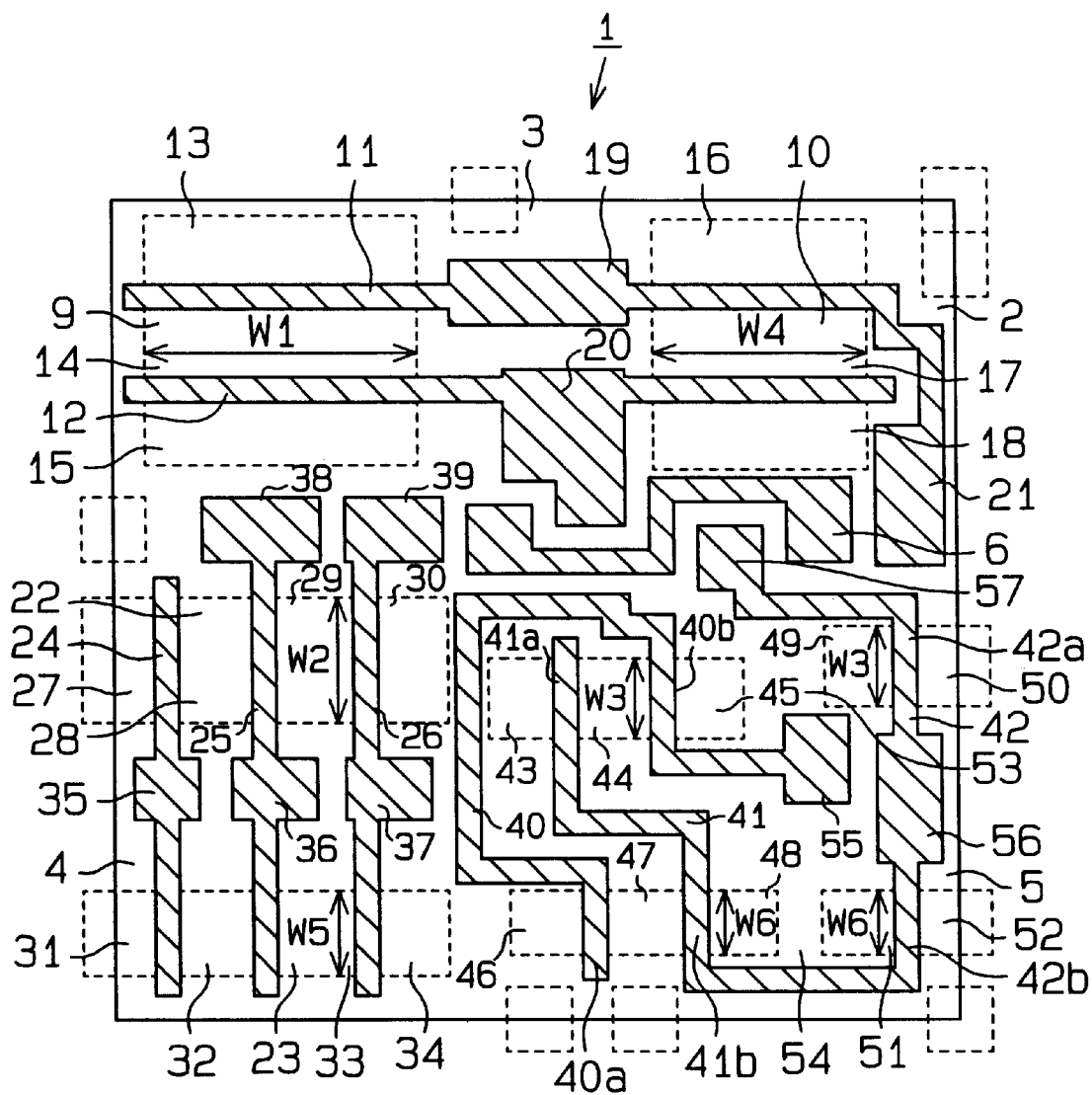
FIG. 1 is a plan view illustrating the structure of a basic cell according to the first embodiment of this invention.

FIG. 1 illustrates the structure of a basic cell 1 according to the first embodiment. This basic cell 1 comprises a rectangular cell substrate 2, a first device region 3, which occupies about one third of the cell substrate 2 at the upper portion thereof, a second device region 4, which occupies about one fourth of the cell substrate 2 at the lower left portion thereof, a third device region 5, which occupies about one third of this cell substrate 2 at the lower right portion thereof, and an interconnection pattern 6, which is located in free space between the first device region 3 and the third device region 5. The interconnection pattern 6 is formed of, for example, tungsten polycide.

Provided in the first device region 3 are a first P type transistor group 9 and a first N type transistor group 10. The first P type transistor group 9 has first and second gate electrodes 11 and 12 of polysilicon, which extend in parallel horizontally in the figure, and first, second and third P type source/drain regions 13, 14 and 15. The first to third P type source/drain regions 13 to 15 are separated from one another in the vertical direction by the left-hand side portions of the first and second gate electrodes 11 and 12.

The first N type transistor group 10 has the first and second gate electrodes 11 and 12, and first, second and third N type source/drain regions 16, 17 and 18. The first to third N type source/drain regions 16 to 18 are separated from one another in the vertical direction by the right-hand side portions of the first and second gate electrodes 11 and 12.

That is, two P type transistors in the first P type transistor group 9 and two N type transistors in the first N type transistor group 10 share the first gate electrode 11 or the second gate electrode 12 in a one-to-one relationship.

Further, to effectively use the free space in the first device region 3, wide portions 19, 20 and 21, which can form contact portions by properly extending the center portions or end portions of the first and second gate electrodes 11 and 12, are formed. A second P type transistor group 22 and a second N type transistor group 23 are provided in the second device region 4.

The second P type transistor group 22 has third, fourth, and fifth gate electrodes 24, 25 and 26 of polysilicon, which extend in parallel vertically in the figure, and fourth, fifth, sixth and seventh P type source/drain regions 27, 28, 29 and 30. The fourth to seventh P type source/drain regions 27 to 30 are separated from one another in the horizontal direction by the upper portions of the third to fifth gate electrodes 24 to 26.

The second N type transistor group 23 has the third, fourth, and fifth gate electrodes 24, 25 and 26, and fourth, fifth, sixth and seventh N type source/drain regions 31, 32, 33 and 34. The fourth to seventh N type source/drain regions 31 to 34 are separated from one another in the horizontal direction by the lower portions of the third to fifth gate electrodes 24 to 26.

That is, three P type transistors in the second P type transistor group 22 and three N type transistors in the second N type transistor group 23 share the third gate electrode 24, the fourth gate electrode 25 or the fifth gate electrode 26 in a one-to-one relationship.

Further, for effective use of the free space in the second device region 4, wide portions 35, 36, 37, 38 and 39, which can form contact portions by properly extending the center portions or end portions of the third to fifth gate electrodes 24 to 26, are formed.

The third device region 5 has sixth, seventh and eighth gate electrodes 40, 41 and 42 of polysilicon. The sixth gate electrode 40 extends, bending at a plurality of points, in a hook form. The seventh gate electrode 41 likewise extends, bending at a plurality of points, in a hook form with a narrow path formed between the sixth and seventh gate electrodes 40 and 41. The eighth gate electrode 42 extends from the end portion of the seventh gate electrode 41 vertically in the figure along the right end of the cell substrate 2. The seventh and eighth gate electrodes 41 and 42 are connected together by a connecting section 42b in the vicinity of one corner of the cell substrate 2.

An outer end portion 40a of the sixth gate electrode 40 and a middle portion 41b of the seventh gate electrode 41 extend in parallel in the vertical direction in the figure. A middle portion 40b of the sixth gate electrode 40 and an inner end portion 41a of the seventh gate electrode 41 extend in parallel in the vertical direction in the figure. The outer end portion 40a of the sixth gate electrode 40 and the inner end portion 41a of the seventh gate electrode 41 are arranged to be substantially located on a vertical straight line with a slight horizontal shift. The middle portions 40b and 41b are likewise arranged to be substantially located on a vertical straight line with a slight horizontal shift.

The third device region 5 further has eighth, ninth and tenth P type source/drain regions 43, 44 and 45, eighth, ninth and tenth N type source/drain regions 46, 47 and 48, eleventh and twelfth P type source/drain regions 49 and 50, and eleventh and twelfth N type source/drain regions 51 and 52. The eighth, ninth and tenth P type source/drain regions 43, 44 and 45 are separated from one another horizontally in the figure by the middle portion 40b of the sixth gate electrode 40 and the inner end portion 41a of the seventh gate electrode 41.

The eighth, ninth and tenth N type source/drain regions 46, 47 and 48 are separated from one another horizontally in the figure by the outer end portion 40a of the sixth gate electrode 40 and the middle portion 41b of the seventh gate electrode 41. The eleventh and twelfth P type source/drain regions 49 and 50 are separated from each other by one end portion 42a of the eighth gate electrode 42. The eleventh and twelfth N type source/drain regions 51 and 52 are separated from each other by the other end portion 42b of the eighth gate electrode 42.

The middle portion 40b of the sixth gate electrode 40, the inner end portion 41a of the seventh gate electrode 41, the eighth, ninth and tenth P type source/drain regions 43, 44 and 45, one end portion 42a of the eighth gate electrode 42, and the eleventh and twelfth P type source/drain regions 49 and 50 constitute a third P type transistor group 53. The outer end portion 40a of the sixth gate electrode 40, the middle portion 41b of the seventh gate electrode 41, the eighth, ninth and tenth N type source/drain regions 46, 47 and 48, the other end portion 42b of the eighth gate electrode 42, and the eleventh and twelfth N type source/drain regions 51 and 52 constitute a third N type transistor group 54.

Further, for effective use of the free space in the third device region 5, wide portions 55, 56 and 57, which can form contact portions by properly extending the center portions or end portions of the sixth to eighth gate electrodes 40 to 42, are formed.

In the basic cell 1 according to this embodiment, the ratio (W1:W2:W3) of the width W1 of the first to third P type source/drain regions 13 to 15 (i.e., the gate width of the first P type transistor group 9), the width W2 of the fourth to seventh P type source/drain regions 27 to 30 (i.e., the gate width of the second P type transistor group 22), and the width W3 of the eighth to twelfth P type source/drain regions 43 to 45, 49 and 50 (i.e., the gate width of the third P type transistor group 53) is 6:3:2.

Further, the ratio (W4:W5:W6) of the width W4 of the first to third N type source/drain regions 16 to 18 (i.e., the gate width of the first N type transistor group 10), the width W5 of the fourth to seventh N type source/drain regions 31 to 34 (i.e., the gate width of the second N type transistor group 23), and the width W6 of the eighth to twelfth N type source/drain regions 46 to 48, 51 and 52 (i.e., the gate width of the third N type transistor group 54) is 10:4:3.

According to the basic cell 1 of this embodiment, the ratio of the gate width W1 of the first P type transistor group 9 to the gate width W4 of the first N type transistor group 10 is 6:5. The ratio of the gate width W2 of the second P type transistor group 22 to the gate width w5 of the second N type transistor group 23 is set to 3:2, and the ratio of the gate width W3 of the third P type transistor group 53 to the gate width W6 of the third N type transistor group 54 is set to 4:3.

That is, according to this embodiment, the sizes of the first, second and third P type transistor groups 9, 22 and 53 on the cell substrate 2 are different from one another, and the sizes of the first, second and third N type transistor groups 10, 23 and 54 are different from one another.

Figure 2:
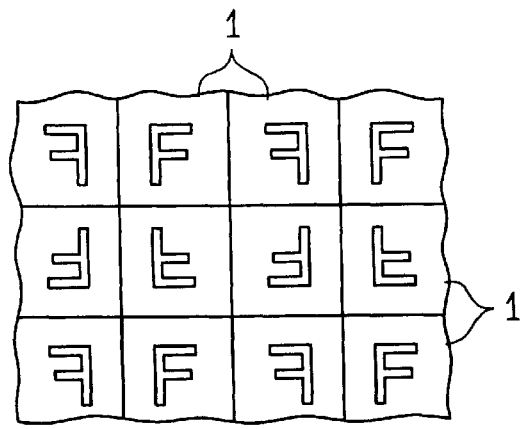
FIG. 2 is a plan view showing the layout of the basic cells in FIG. 1.
Figure 4:
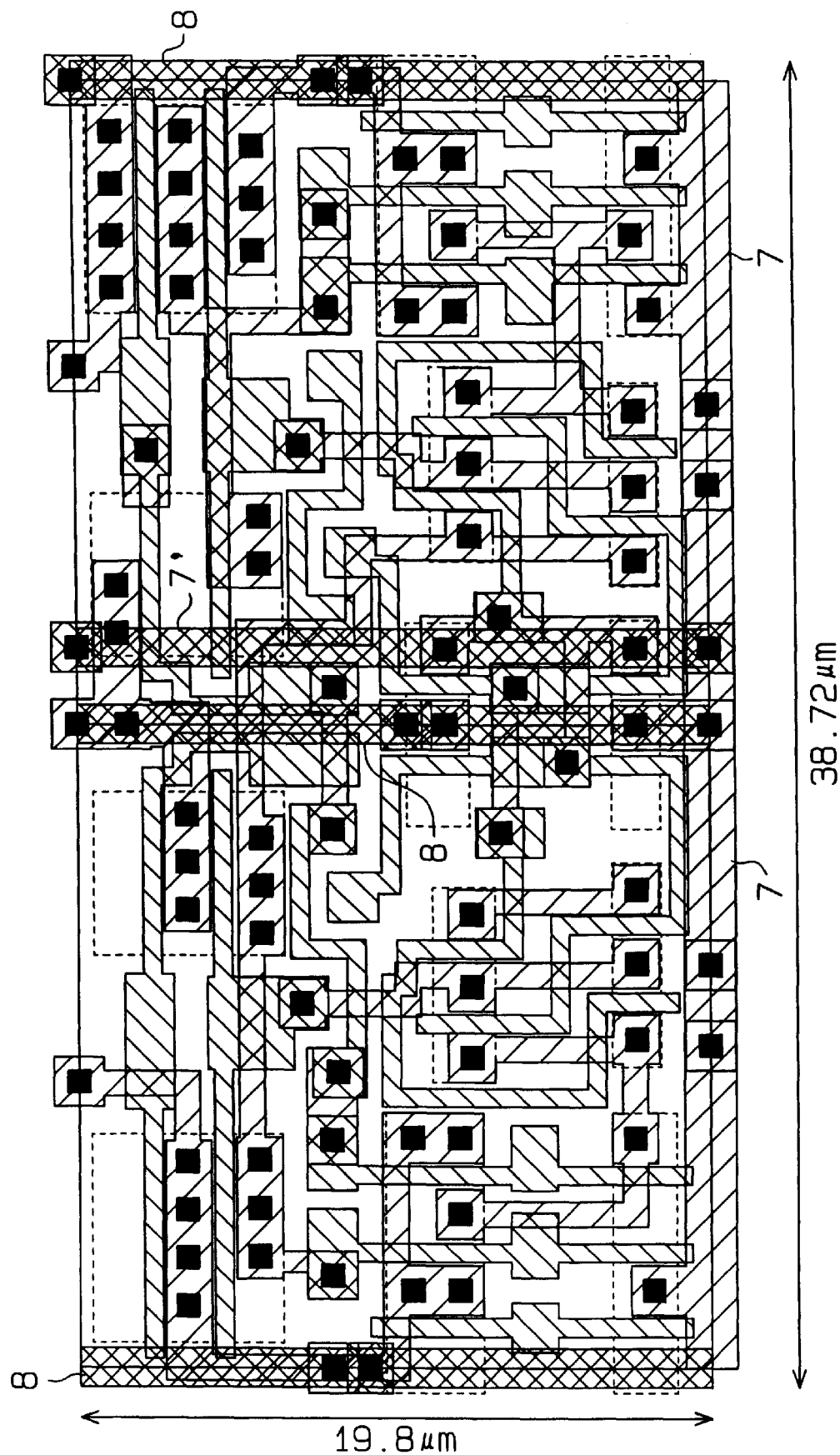
FIG. 4 is an actual circuit diagram when a DFF circuit shown in FIG. 17 is constructed using the basic cells shown in FIG. 1.
Figure 5:
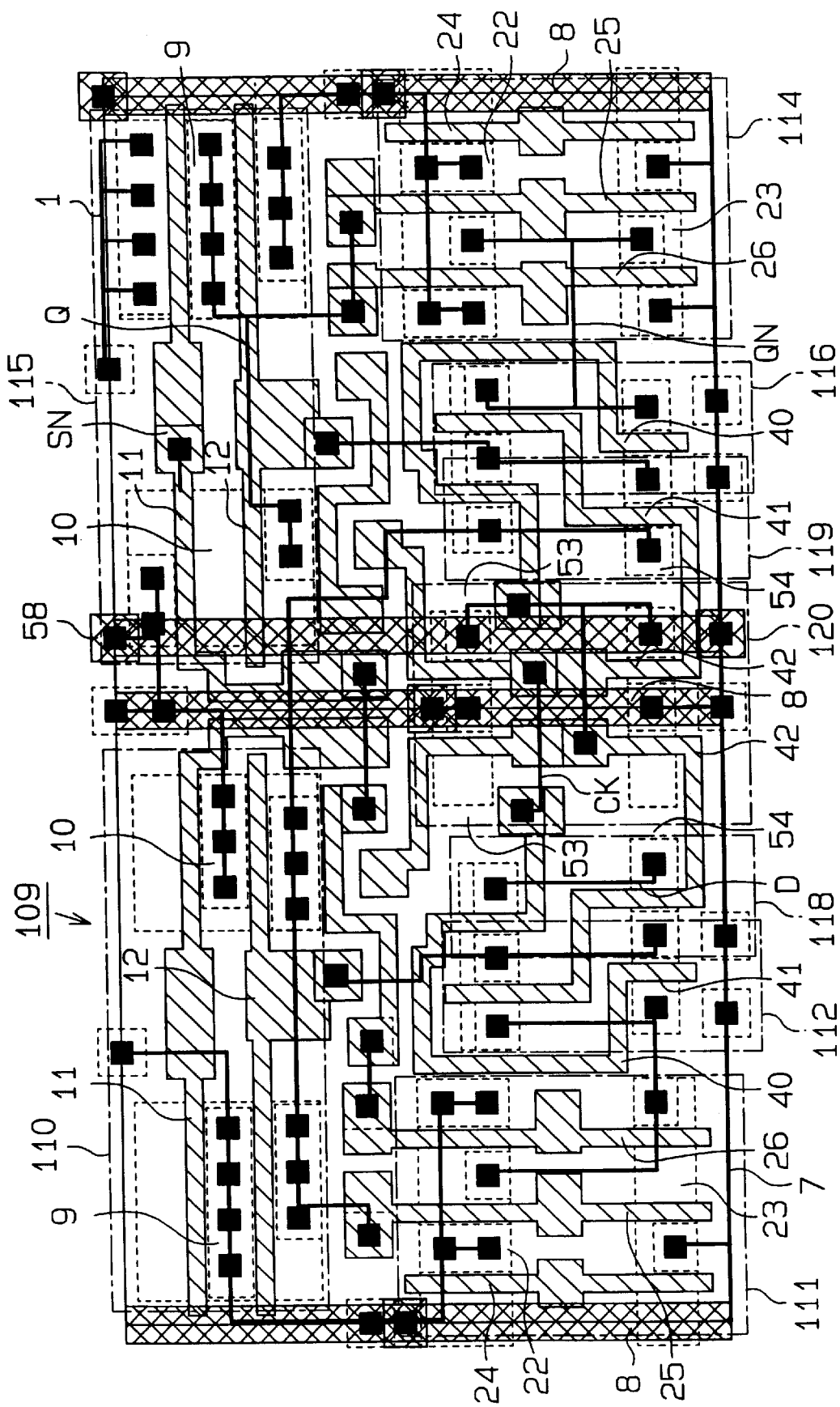
FIG. 5 is a circuit diagram showing the interconnecting section in FIG. 4 in a simple form.
Figure 17:
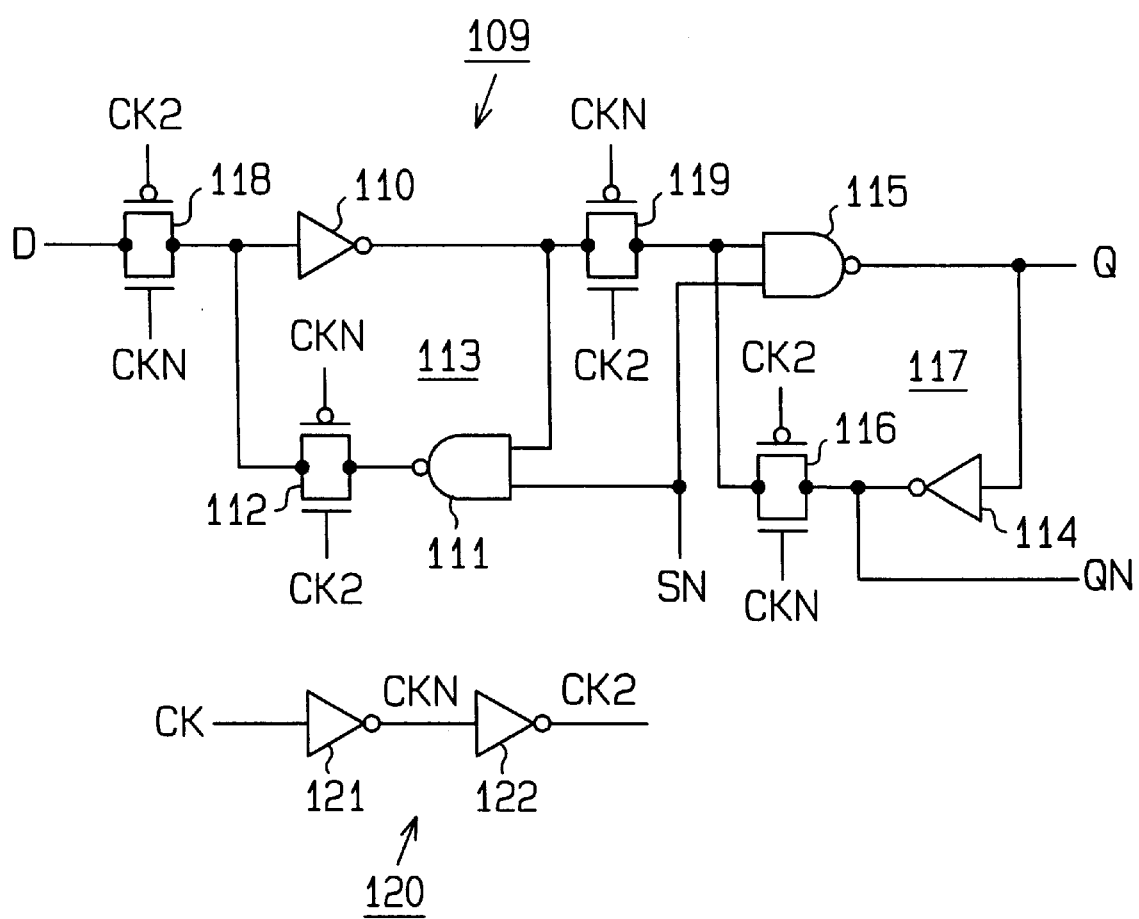
FIG. 17 is a circuit diagram of an ordinary DFF circuit.

As shown in FIG. 2, the basic cells 1 are arranged in a matrix form on the semiconductor substrate. In the arrangement, the adjoining basic cells 1 are in a mirror arrangement. FIG. 4 is an actual circuit diagram where the DFF circuit 109 shown in FIG. 17 is constructed using the basic cells 1 shown in FIG. 1, and FIG. 5 shows the interconnecting section in FIG. 4 by solid lines. The interconnecting lines that connect the individual transistors are formed on a first metal interconnection layer. In the figure, the mark "■" indicates a contact portion.

The basic cells 1 are set in a mirror arrangement in the horizontal direction. The large-size transistors in the first device region 3 are selected for the inverter 110 and the NAND gate 115, which require a large drive performance, the middle-size transistors in the second device region 4 are selected for the NAND gate 111 and the inverter 114, which need a smaller drive performance than the inverter 110 and NAND gate 115, the small-size transistors in the third device region 5 are selected for the transfer gates 112, 116, 118 and 119 and the clock circuit 120, which demand a small drive performance, and the individual transistors are mutually connected to construct the DFF circuit 109.

A GND line 7 (hereinafter called "horizontal line 7") for the ground, which extends horizontally in the figure, is provided at the lower end portion of the cell substrate 2, and a VDD line 8 (hereinafter called "vertical line 8") for a high voltage supply, which extends vertically in the figure, is provided at the side portions of the cell substrate 2. The horizontal line 7 is provided on the first metal interconnection layer, and the vertical line 8 on the second metal interconnection layer. Further, vertical lines 58 extend on the second metal interconnection layer at one side portion of the right basic cell 1 (vertically in the figure). This vertical line 58 is connected to the GND line 7 on the first metal interconnection layer. The horizontal line 7, and the vertical lines 58 and 8 are connected to the individual transistors. The first metal interconnection layer and the second metal interconnection layer are insulated from each other by an insulator film.

The vertical line 58 is a GND line locally provided within a cell, while the horizontal line 7 and the vertical line 8 are a VDD line or a GND line that are commonly shared by each cell.

The basic cell 1 according to this embodiment has the following features.

a) Since the sizes of the transistors in the first to third device regions 3 to 5 are different from one another, it is possible to freely select transistors, the sizes of which match with the required drive performances of the individual logic circuits, such as an inverter and a NAND gate.

b) The layout direction of the transistor groups 9 and 10 in the first device region 3 is different from the layout direction of the transistor groups 22 and 23 in the second device region 4 (particularly, the layout directions differ by 90 degrees). At the time of connecting the individual transistors so that the interconnecting lines do not run over the transistor regions, the interconnection layers need not be modified, thus improving the interconnecting efficiency, and the interconnecting lines can be shortened.

Figure 3A:
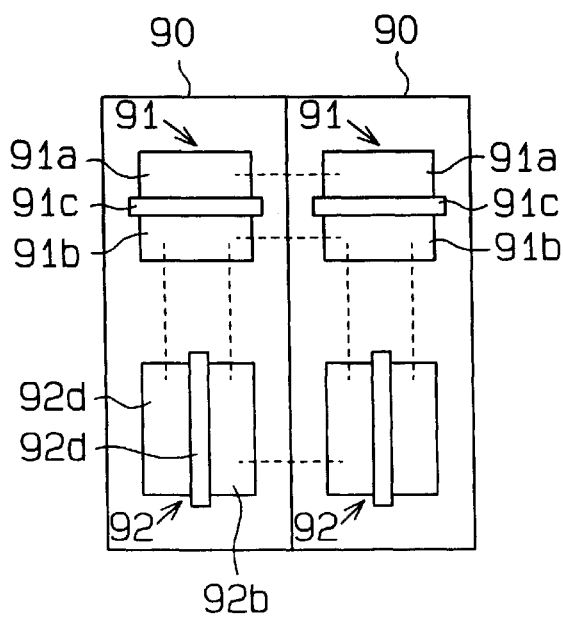
FIG. 3(a) is a plan view showing how the basic cells in FIG. 1 are coupled.
Figure 3B:
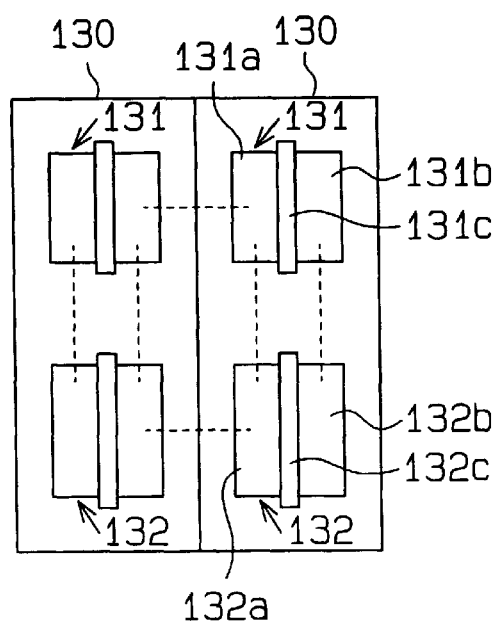
FIG. 3(b) is a plan view showing how conventional basic cells are coupled.

FIG. 3(b) presents a diagram of a conventional basic cell showing two basic cells 130 arranged adjacent to each other. The basic cell 130 has two MOS transistors 131 and 132, which are different in size, arranged in the same direction. The transistors 131 and 132 respectively have a pair of source/drain regions 131a and 131b and a pair of source/ drain regions 132a and 132b, and gate regions 131c and 132c, each located between the associated source/drain region pair. In this case, there are six interconnection paths (indicated by the broken lines) for connecting the individual source/drain regions 131a, 131b, 132a and 132b so that the interconnecting lines do not run over the gate regions 132c of the transistors 131 and 132.

FIG. 3(a) presents a diagram of basic cells, according to this embodiment, showing two basic cells 90 arranged adjacent to each other. The basic cell 90 is laid out in such a manner that gate regions 91c and 92c of two transistors 91 and 92, which are different in size, extend perpendicular to each other. In this case, there are seven interconnection paths (indicated by the broken lines) for connection among source/drain regions 91a, 91b, 92a and 92b of the transistors 91 and 92 so that the interconnecting lines do not run over the gate regions 91c and 92c of the transistors 91 and 92. This is because the perpendicular arrangement of the transistors 91 and 92 causes two source/drain regions 91a and 91b of a pair of transistors 91 to face each other. This results in an increased number of interconnection paths and thus increases the degree of freedom in the interconnecting directions.

c) In the third device region 5, the sixth and seventh gate electrodes 40 and 41 are bent so that P type transistors, the gate electrodes of which are the middle portion 40b of the sixth gate electrode 40, and N type transistors, the gate electrodes of which are the middle portion 41b of the seventh gate electrode 41, are substantially positioned on a vertical straight line, and N type transistors, the gate electrodes of which are the outer end portion 40a of the sixth gate electrode 40, and P type transistors, the gate electrodes of which are the inner end portion 41a of the seventh gate electrode 41, are substantially positioned on a vertical straight line. In the case where a transfer gate is formed using those gate electrodes, the individual interconnecting lines that connect the source/drain regions of the P type transistors to the source/drain regions of the N type transistors do not cross one another.

It is therefore possible to form interconnecting lines for connecting P type transistors and N type transistors on a single layer and make the interconnecting lines shorter to reduce the circuit area of the transfer gate itself. This contributes to reducing the area of a semiconductor IC.

d) Since the interconnecting line 6 is provided and the wide portions for contacts are provided at the center portions and end portions of the individual gate electrodes, the degree of freedom for the interconnecting positions is increased while the free area in each cell can be effectively used. Particularly, the provision of the wide portions 19, 20, 35–37 and 56 at the center portions of the individual gate electrodes ensures a wider selection of contacts than the prior art.

e) Since the P type transistors and N type transistors share gate electrodes in the first to third device regions 3 to 5, it is unnecessary to make interconnections by using metal wires, ensuring a greater degree of freedom in the interconnection area accordingly.

f) Unlike the prior art, the GND and VDD interconnections are provided by not only the horizontal line 7 but also the vertical lines 58 and 8. For the basic cell 1 of this embodiment, in which the directions of the transistors differ by 90 degrees, it is possible to shorten the horizontal line 7 or the vertical lines 58 and 8 and the lines that connect the individual transistors.

g) The individual interconnecting lines are separated into two layers, with an insulator film in between, in such a manner that the lines that connect the individual transistors and the horizontal line 7 run on the first layer, while the vertical lines 58 and 8 run on the second layer. Even in the case where the lines that connect the individual transistors (e.g., the lines that connect between the basic cells) cross the vertical lines 58 and 8, therefore, they can go under the vertical lines 58 and 8, thus increasing the degree of freedom of interconnection.

h) The gate electrodes not used as a part of a circuit can directly be used as a part of the interconnection.

As apparent from the above and FIG. 5, the DFF circuit 109, which is constructed by using the basic cell 1 of this embodiment, has a very small likelihood of the interconnecting lines crossing one another or going over the contact regions of the transistors, has a shorter total interconnection distance and has more contacts in the source/drain regions. What is more, it is possible to select transistors in accordance with the drive performance of the circuit. Thus, a faster operation speed and lower power consumption can be accomplished for the DFF circuit. In particular, because DFF circuits generally occupy a large area in semiconductor chips, reducing the area of the DFF circuit greatly contributes to miniaturizing semiconductor chips.

Figure 18:
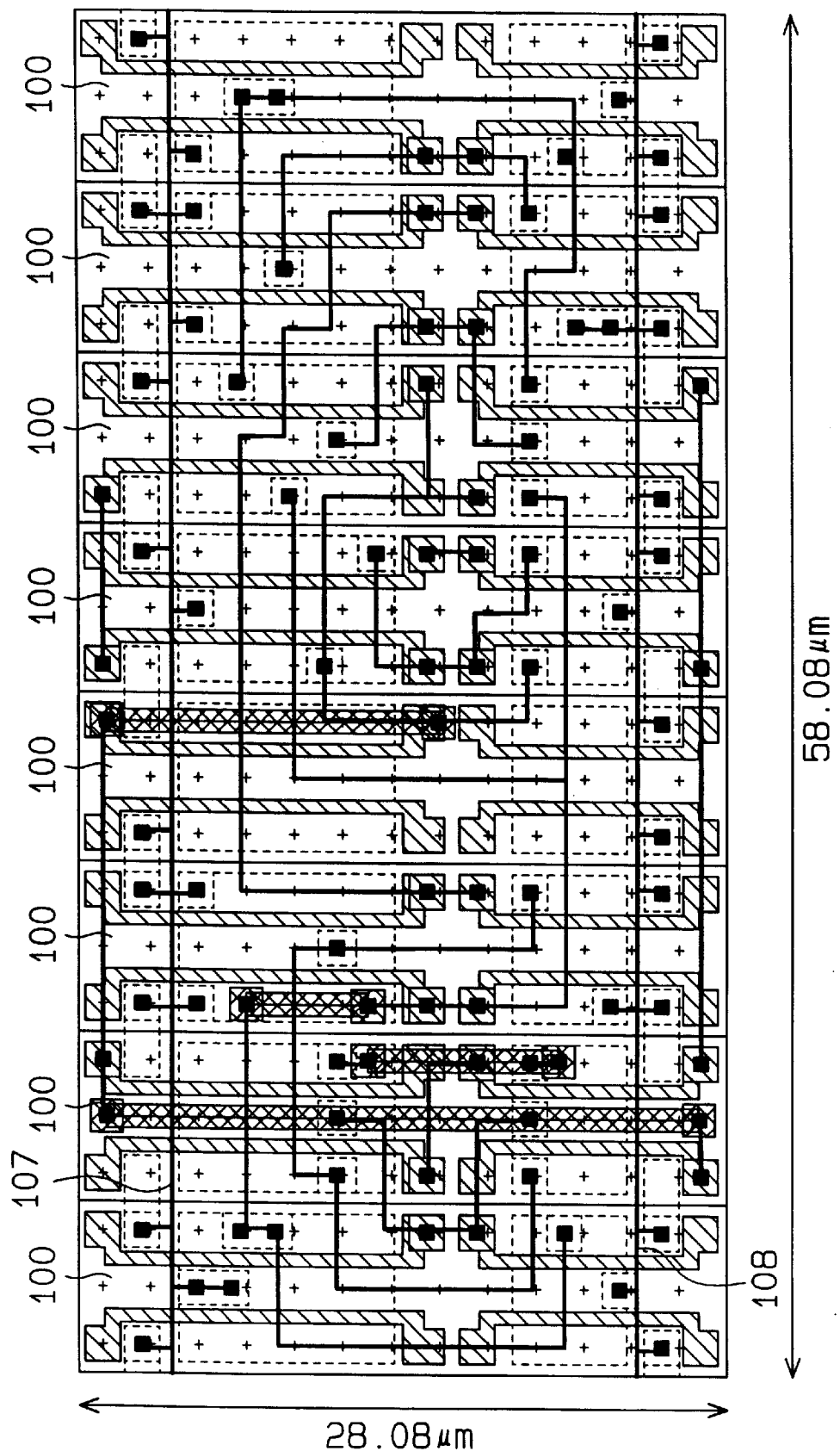
FIG. 18 is an actual circuit diagram when the DFF circuit shown in FIG. 17 is constructed using the basic cells shown in FIG. 16.

Furthermore, while the DFF circuit in FIG. 18 has an area of 1630.89 $\mu m^2$ (=58.08×28.08 $\mu m$), the DFF circuit in FIG. 4 (FIG. 5) has an area of 766.66 $\mu m^2$ (=38.72×19.80 $\mu m$), about 47% of the conventional circuit.

Now, for the comparison of the input capacitance of the prior art with that of this embodiment, the gate widths of the transistors used in the clock circuit in the prior art and the one in this embodiment will be compared with each other. Given that the P type transistors of the conventional basic cell 100 have a gate width of 9.28 $\mu m$ and the N type transistors have a gate width of 5.0 $\mu m$, it is possible to select the transistors in the third P type transistor group 53, the gate width (W3) of which is 2.0 $\mu m$, and the transistors in the third N type transistor group 54, the gate width (W6) of which is 1.5 $\mu m$, in the basic cell 1 of this embodiment. Thus, this embodiment needs only about one fourth of the gate width or the input capacitance of the prior art.

This embodiment may be modified in the following forms. In such modifications, the same advantages are obtained.

Figure 6:
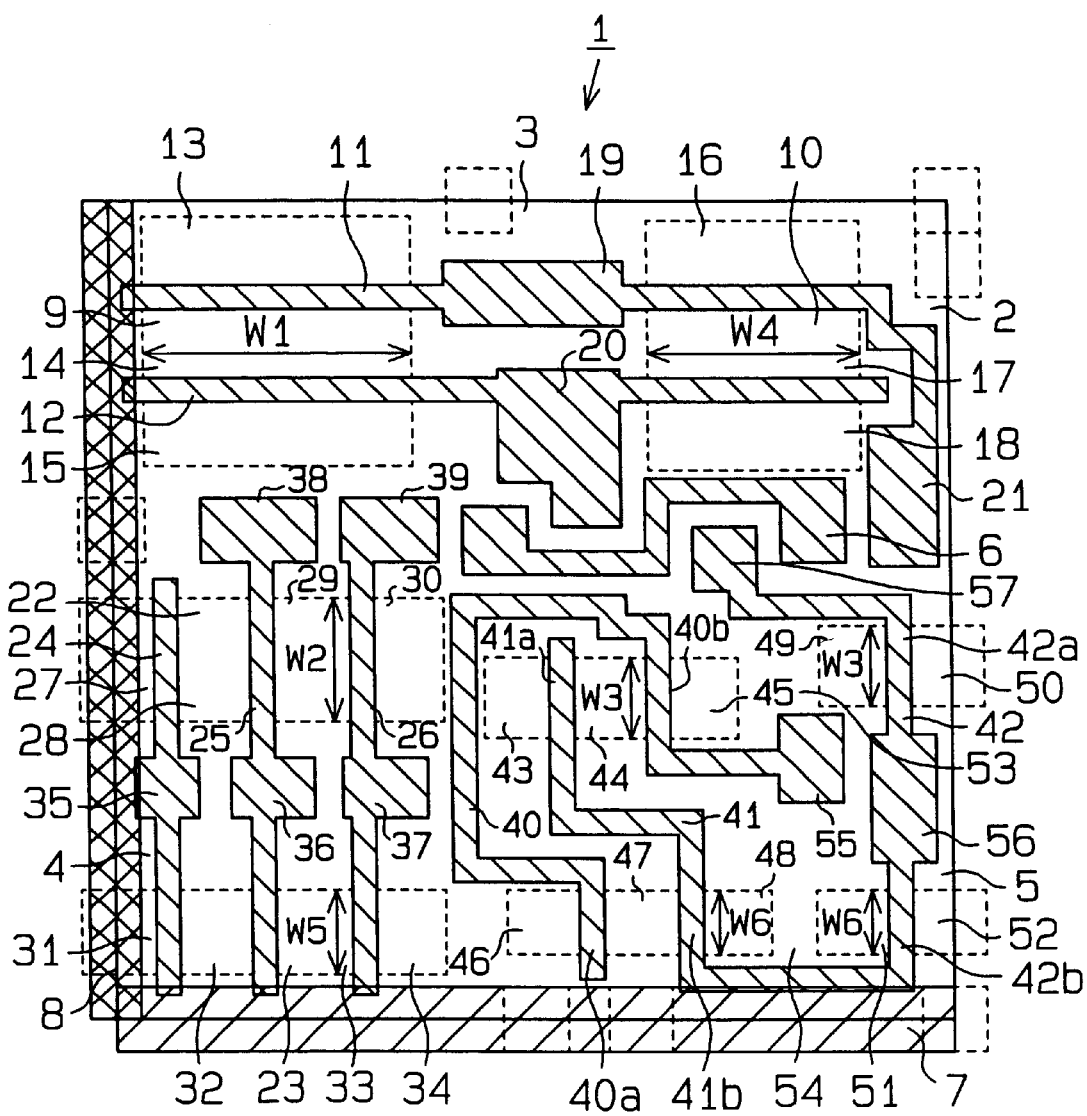
FIG. 6 is a plan view illustrating the structure of a basic cell according to the second embodiment of this invention.

(1) Although the basic cell 1 of the first embodiment is not provided with the GND line 7 and the VDD line 8, the GND line 7, which extends horizontally in the figure, may be provided at the lower end portion of the cell substrate 2, and the VDD line 8, which extends vertically in the figure, may be provided at the left end portion of the cell substrate 2, to form a second embodiment shown in FIG. 6.

In this case, as in the first embodiment, the individual interconnecting lines are separated into two layers with an insulator film in between. The one interconnection lies on the first layer, and the other interconnection on the second layer. This design permits the lines connecting the individual transistors to be led out from the three sides other than the lower end portion of the basic cell 1, thus increasing the degree of freedom of interconnection.

In the second embodiment, the positions for the GND line 7 and the VDD line 8 are not limited to the lower end portion and the left end portion of each cell, but may be the upper end portion and the right end portion. In short, those lines can be provided at any end portions so long as they extend in different directions (preferably different by 90 degrees).

Figure 7:
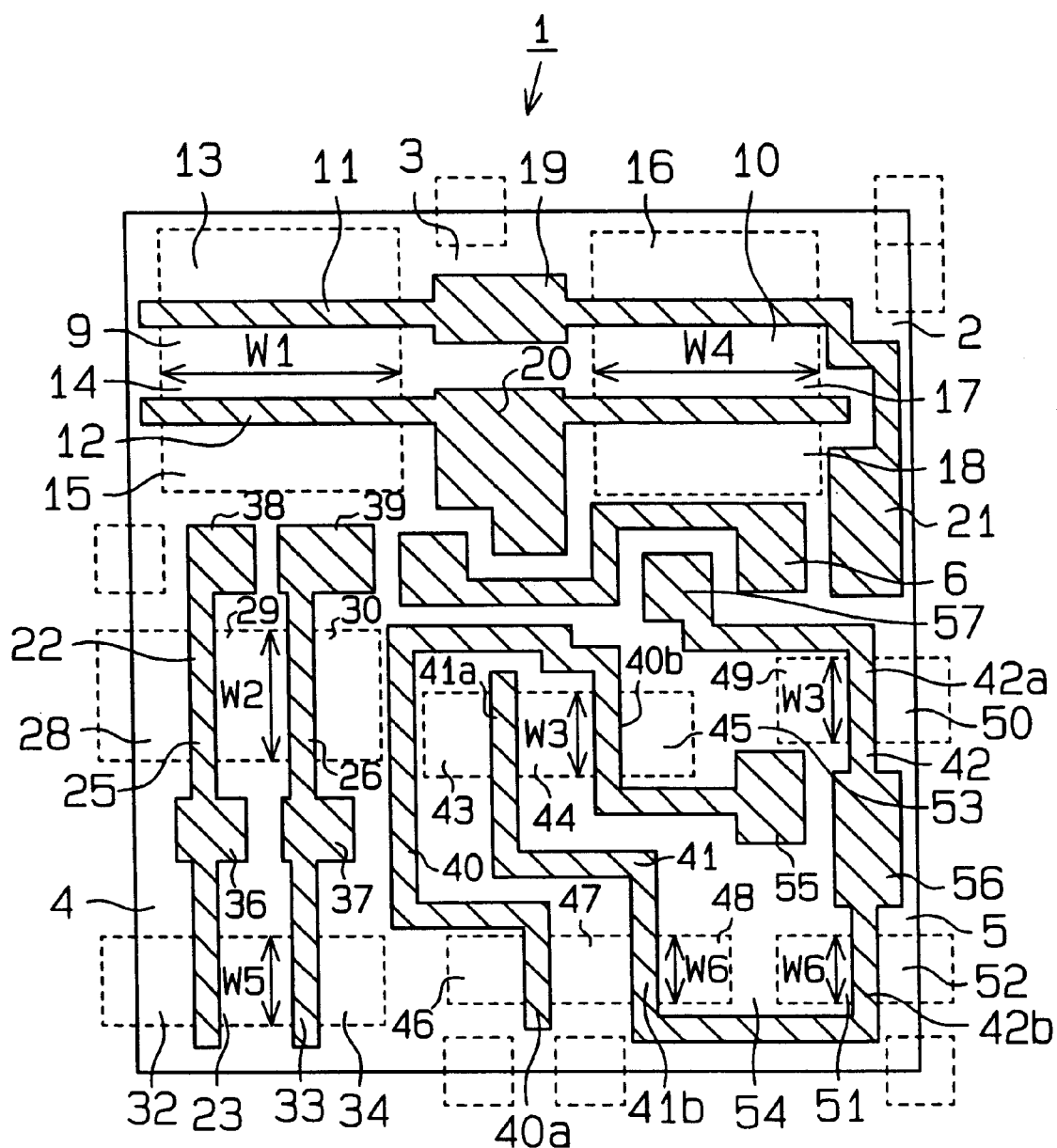
FIG. 7 is a plan view depicting the structure of a basic cell according to the third embodiment of this invention.
Figure 8:
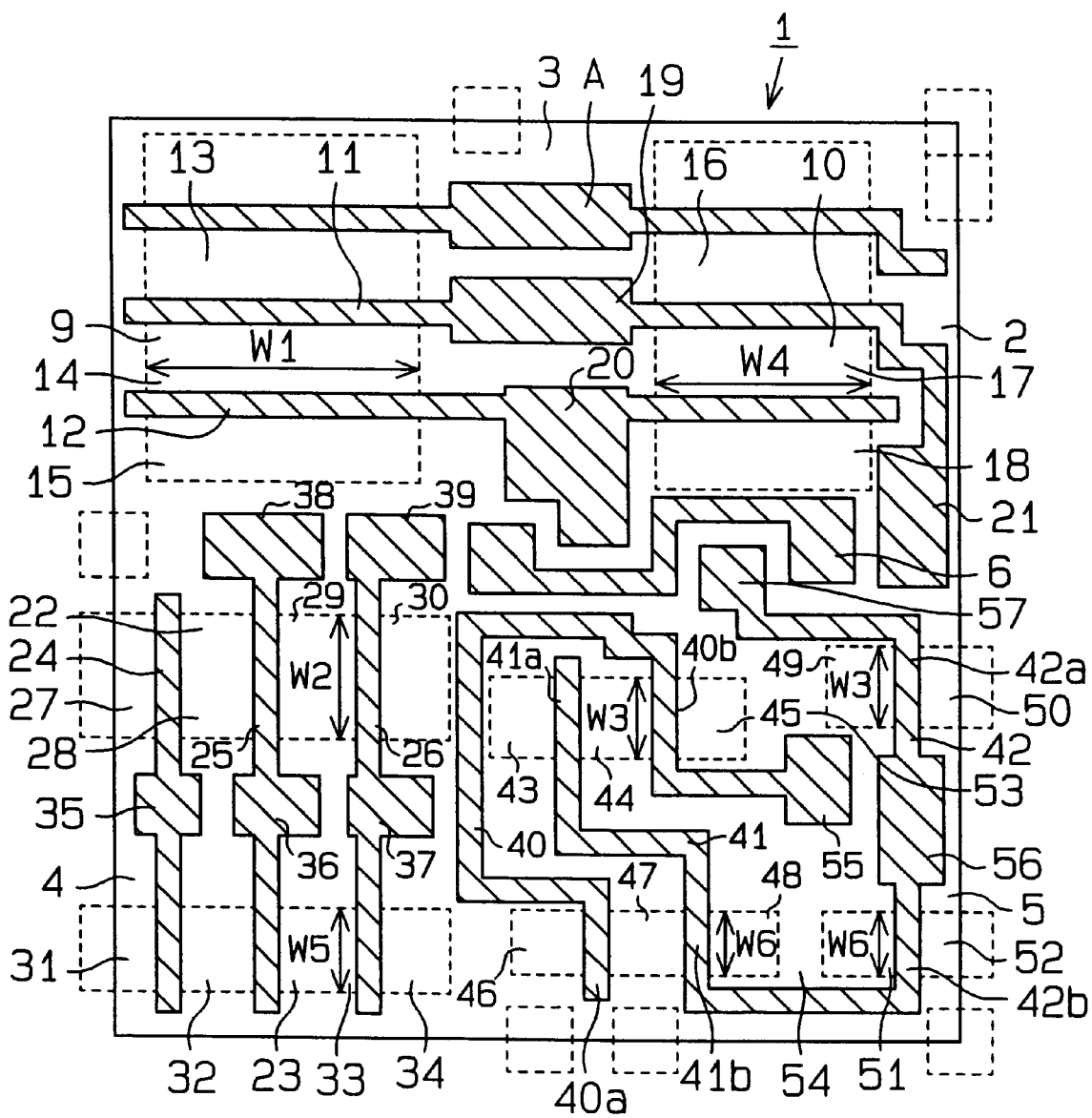
FIG. 8 is a plan view showing the structure of a basic cell according to a modification of the third embodiment of this invention.

(2) As a third embodiment, FIG. 7 shows a case where the number of the gate electrodes of the second device region 4 is reduced to two, and FIG. 8 shows a case where a gate electrode A is added to the first device region 3, providing a total of three gate electrodes. The number of gate electrodes of each device region is adjusted in accordance with the type of IC constructed by using the basic cell. For example, the basic cell 1 shown in FIG. 7, different from the 5-input basic cell in FIG. 1, has four inputs. Therefore, the area of each basic cell in any gate circuit with up to four inputs among various kinds of circuits, such as a DFF circuit, an inverter, an AND gate, an OR gate, a NAND gate, a NOR gate and a composite gate, can be reduced by one gate. This reduces the area of the final circuit.

The basic cell 1 shown in FIG. 8 is a six-input type. Therefore, the area of any circuit with up to six inputs among a DFF circuit, an inverter, an AND gate, an OR gate, a NAND gate, a NOR gate, a composite gate, etc. can be reduced. In particular, a higher drive performance than that of the basic cell of the first embodiment can be obtained by connecting three transistors in the first device region 3 in parallel.

Figure 9:
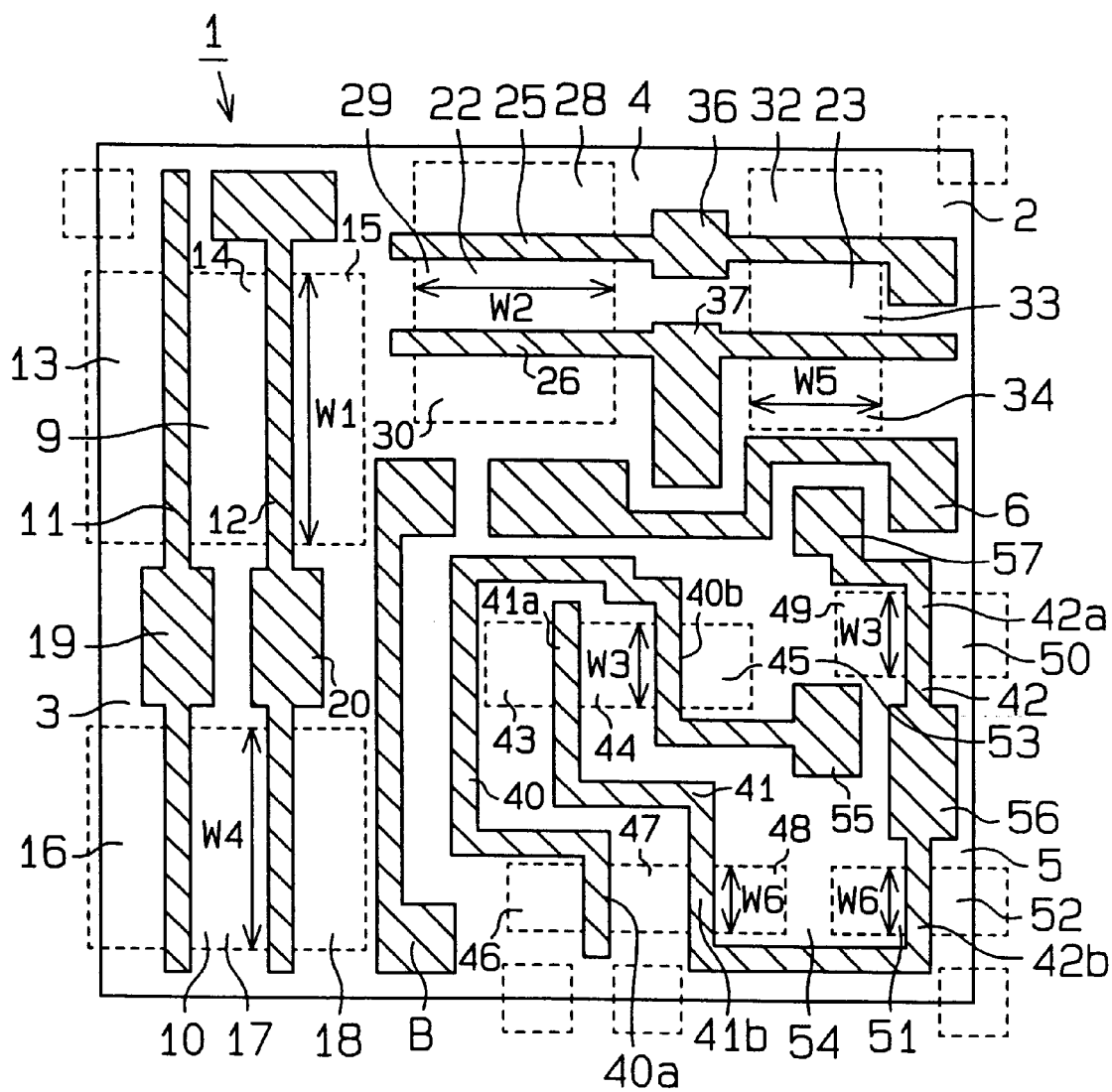
FIG. 9 is a plan view illustrating the structure of a basic cell according to the fourth embodiment of this invention.

(3) As a fourth embodiment, the layout of the first to third device regions 3–5 on the basic cell 1 is changed as shown in FIG. 9. In this case, a different interconnection pattern B can be added.

(4) The ratios of the gate widths of the P type and N type transistors in the individual device regions are not limited to those given in the description of the first embodiment and may be changed as needed.

(5) Although the gate widths W of the transistors are changed for making different sizes of transistors in the above-described embodiments, the gate lengths L may be changed or both may be changed as well.

(6) Although the above-described embodiments are directed to DFF circuits, which are constructed using the basic cell 1, this invention is not limited to this type and may be adapted to construct circuits other than a DFF circuit, such as an inverter, a buffer, a NAND gate, a NOR gate, an AND gate, an OR gate, an AND-NOR gate, an OR-NAND gate, an exclusive OR gate, an exclusive NOR gate, a multiplexer, an adder, a half adder, a decoder and a latch circuit, by laying out one or more basic cells 1 of the above-described embodiments.

Figure 10:
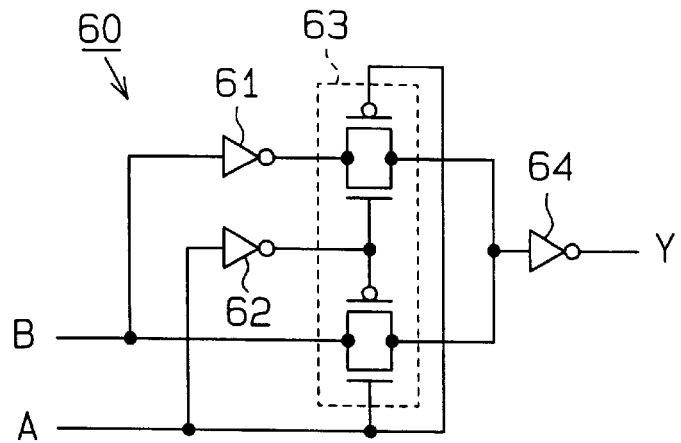
FIG. 10 is a circuit diagram of an exclusive OR gate.

For instance, FIG. 10 is a circuit diagram of an exclusive OR gate 60. In the diagram, the exclusive OR gate 60 comprises three inverters 61, 62 and 64 and a gate section 63 having two transfer gates. A signal Y is output from the last stage inverter 64. The individual transfer gates of the gate section 63 are opened or closed by an input signal A and its inverted signal.

Figure 11:
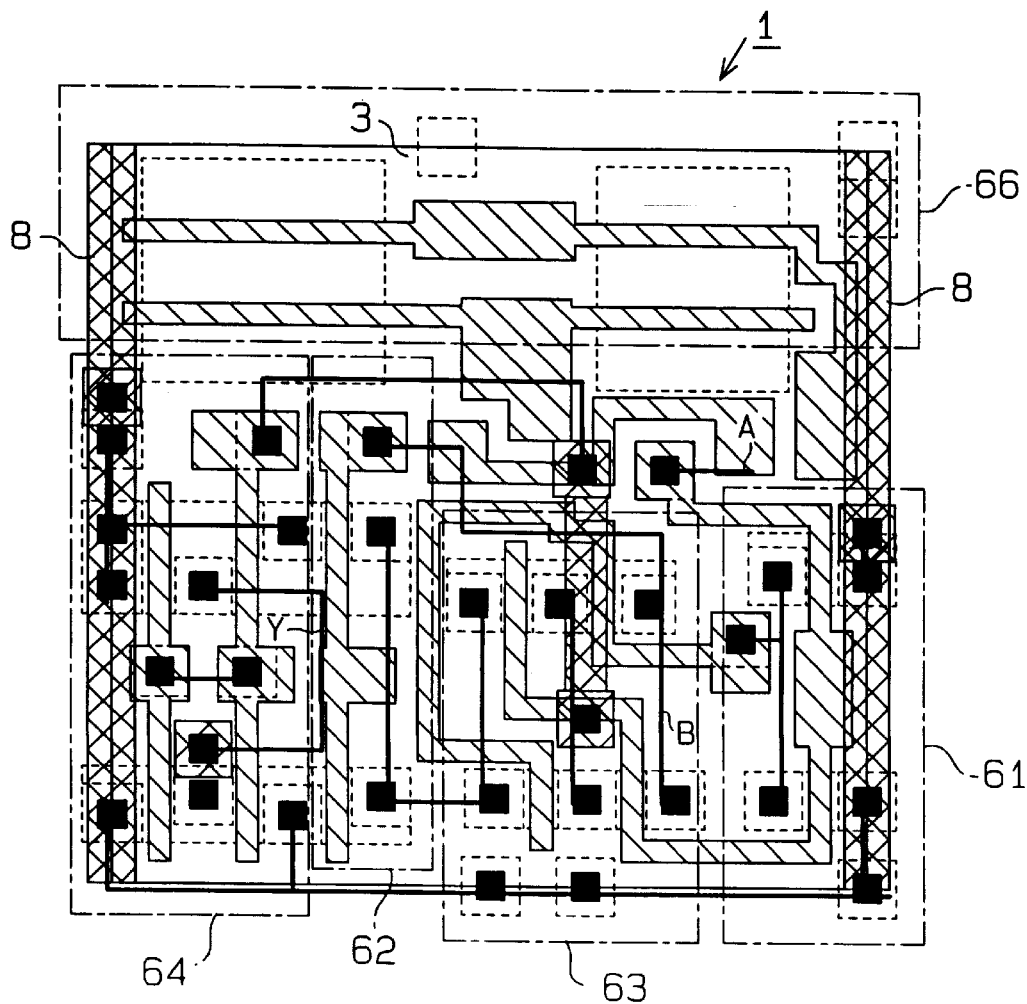
FIG. 11 is an actual circuit diagram when the exclusive OR gate shown in FIG. 10 is constructed using the basic cell shown in FIG. 1.

FIG. 11 is an actual circuit diagram where the exclusive OR gate 60 shown in FIG. 10 is constructed using the basic cell 1 shown in FIG. 1, which shows the interconnection portions by the thick solid lines. The lines that connect the individual transistors are formed on the first metal interconnection layer. The mark "■" indicates a contact portion. This exclusive OR gate 60 is constructed by using first dec cell 1. In this case, the first device region 66 of the basic cell 1 need not be used for the exclusive OR gate 60 and can be used as an interconnection area. It is therefore possible to efficiently use the area of the basic cell 1.

Figure 12:
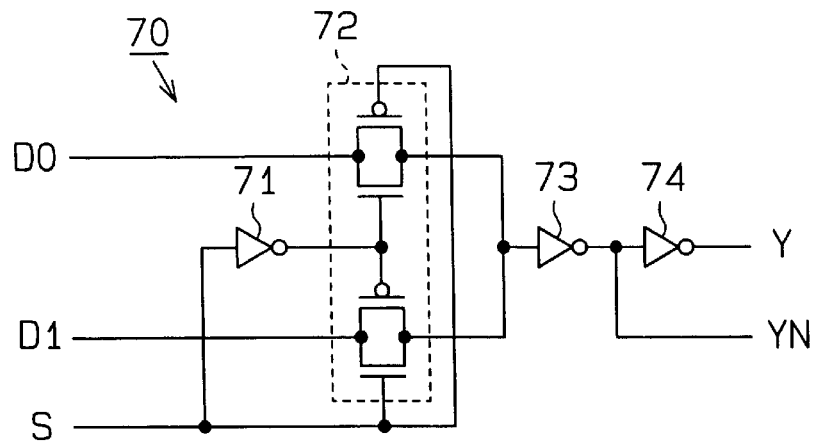
FIG. 12 is a circuit diagram of a multiplexer.

FIG. 12 is a circuit diagram of a multiplexer 70. in this figure, the multiplexer 70 comprises three inverters 71, 73 and 74 and a gate section 72 having two transfer gates. A signal Y is output from the last stage inverter 74 and an inverted signal YN is output from the inverter 73 at the preceding stage of the inverter 74. The individual transfer gates of the gate section 72 are opened or closed by a select signal S and its inverted signal, and either a data signal D0 or D1 is output as the output signal Y.

Figure 13:
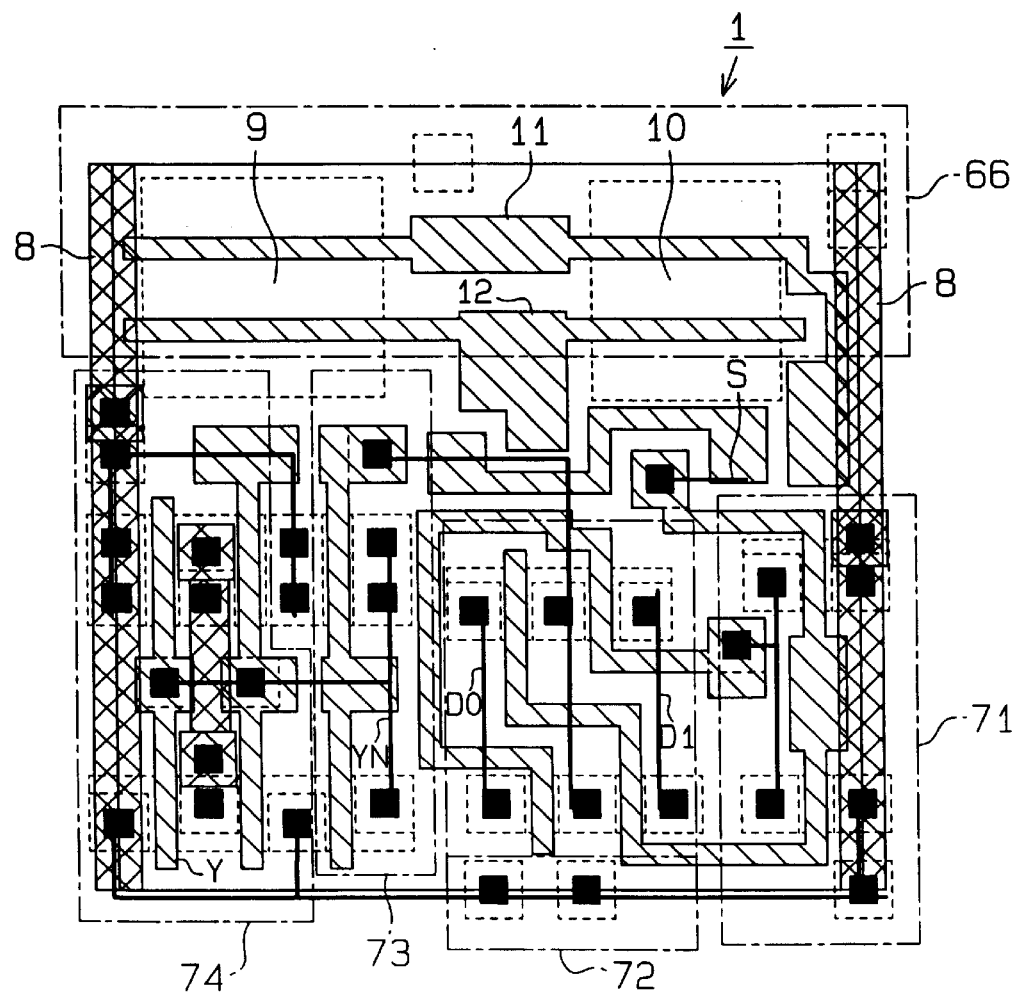
FIG. 13 is an actual circuit diagram when the multiplexer shown in FIG. 12 is constructed using the basic cell shown in FIG. 1.

FIG. 13 is an actual circuit diagram where the multiplexer 70 shown in FIG. 12 is constructed using the basic cell 1 shown in FIG. 1, which shows the interconnection portions by the thick solid lines. The lines that connect the individual transistors are formed on the first metal interconnection layer. The mark "■" indicates a contact portion. This exclusive multiplexer 70 is constructed by using one basic cell 1. In this case too, the first device region 3 of the basic cell 1 need not be used for the multiplexer 70 and can be used as an interconnection area. This makes it possible to efficiently use the area of the basic cell 1.

Figure 14:
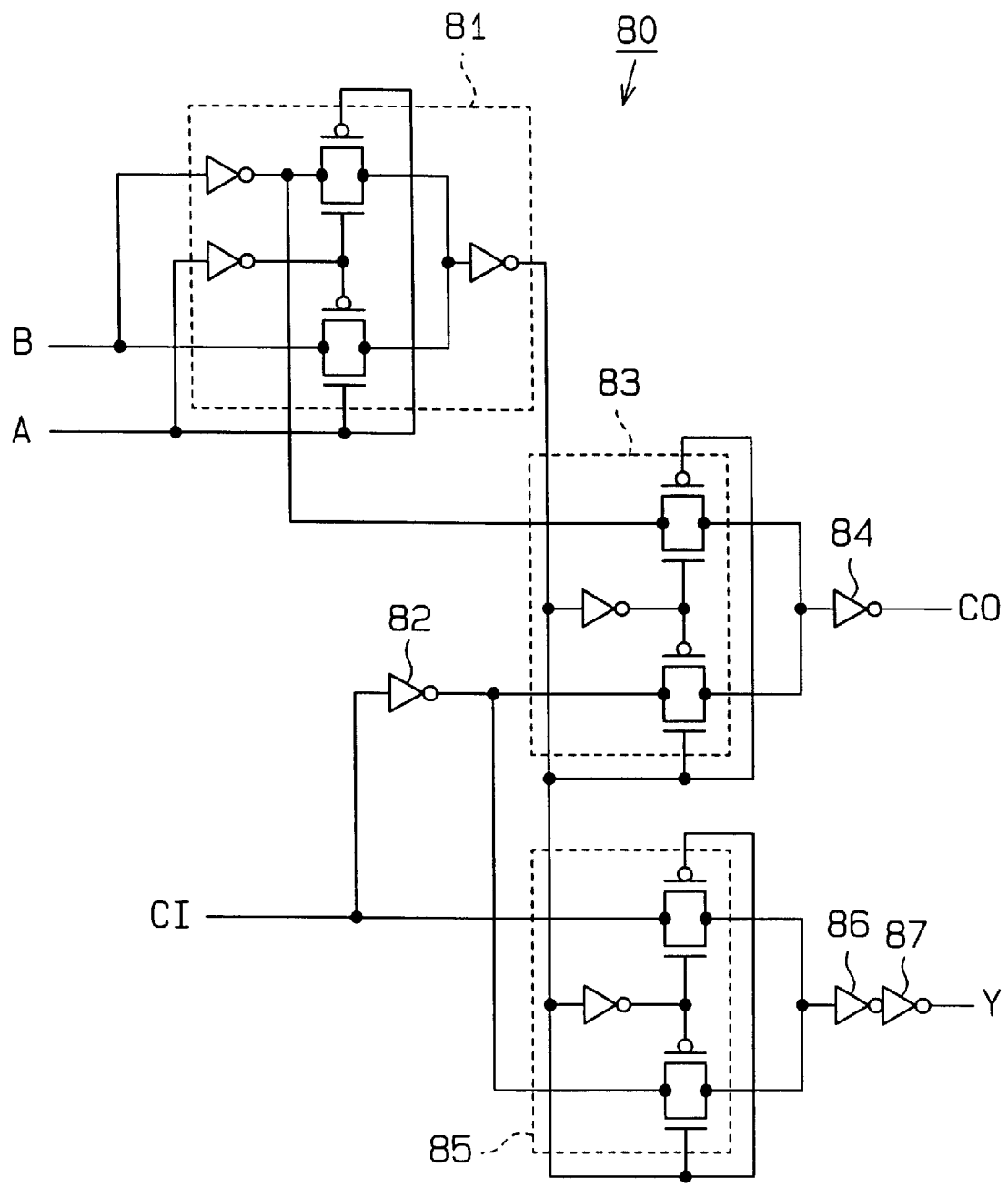
FIG. 14 is a circuit diagram of an adder.

FIG. 14 is a circuit diagram of an adder 80. in the diagram, the adder 80 comprises an exclusive OR gate 81, four inverters 82, 84, 86 and 87 and two selector sections 83 and 85. Each of the selector sections 83 and 85 includes one inverter and two transfer gates. A carry signal C0 is output from the inverter 84, and a signal Y of an added value is output from the inverter 87. The transfer gates of the selector sections 83 and 85 are opened or closed by the output signal of the exclusive OR gate 81 and its inverted signal.

Figure 15:
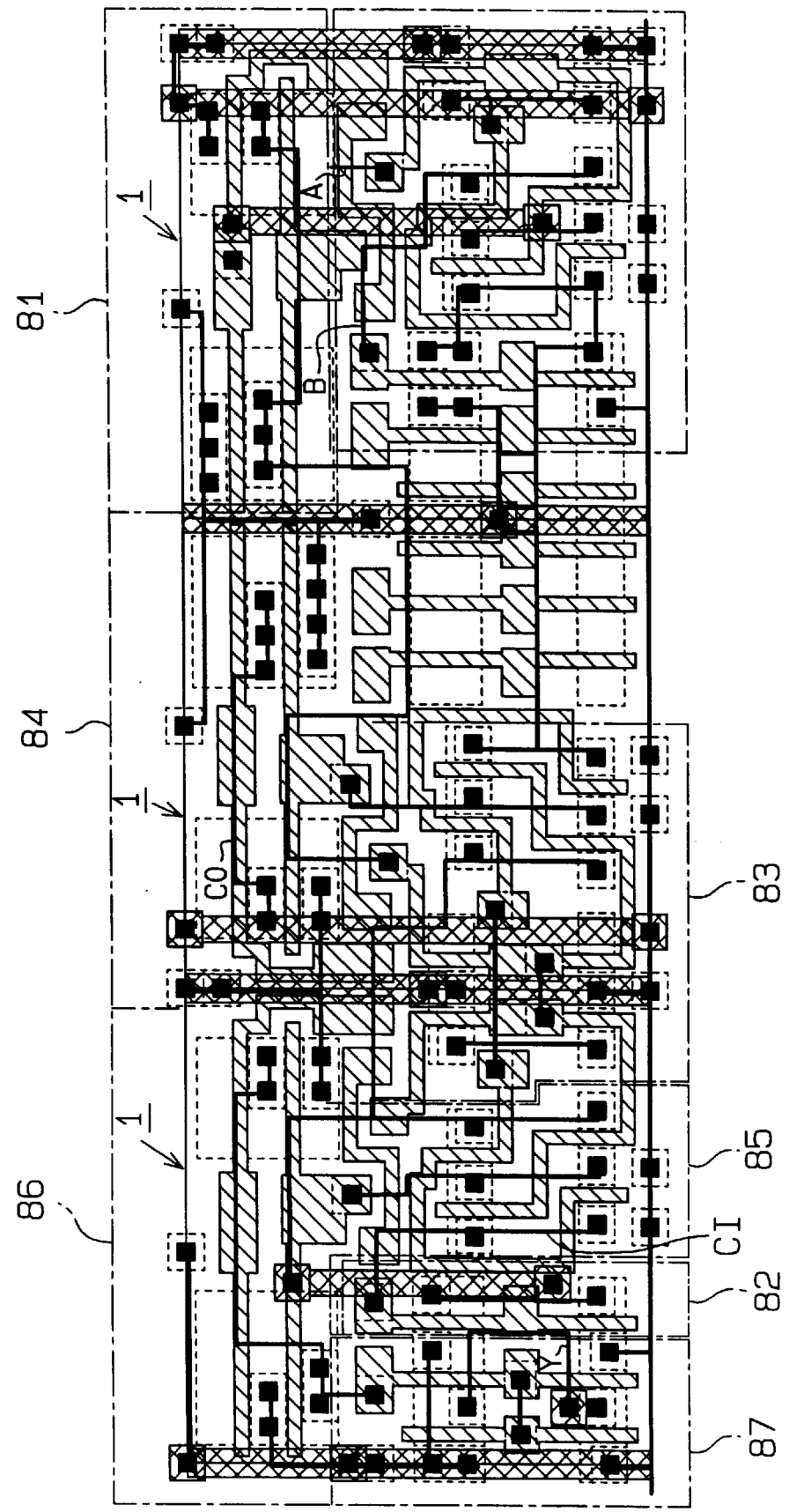
FIG. 15 is an actual circuit diagram when the adder shown in FIG. 14 is constructed using the basic cells shown in FIG. 1.
Figure 16:
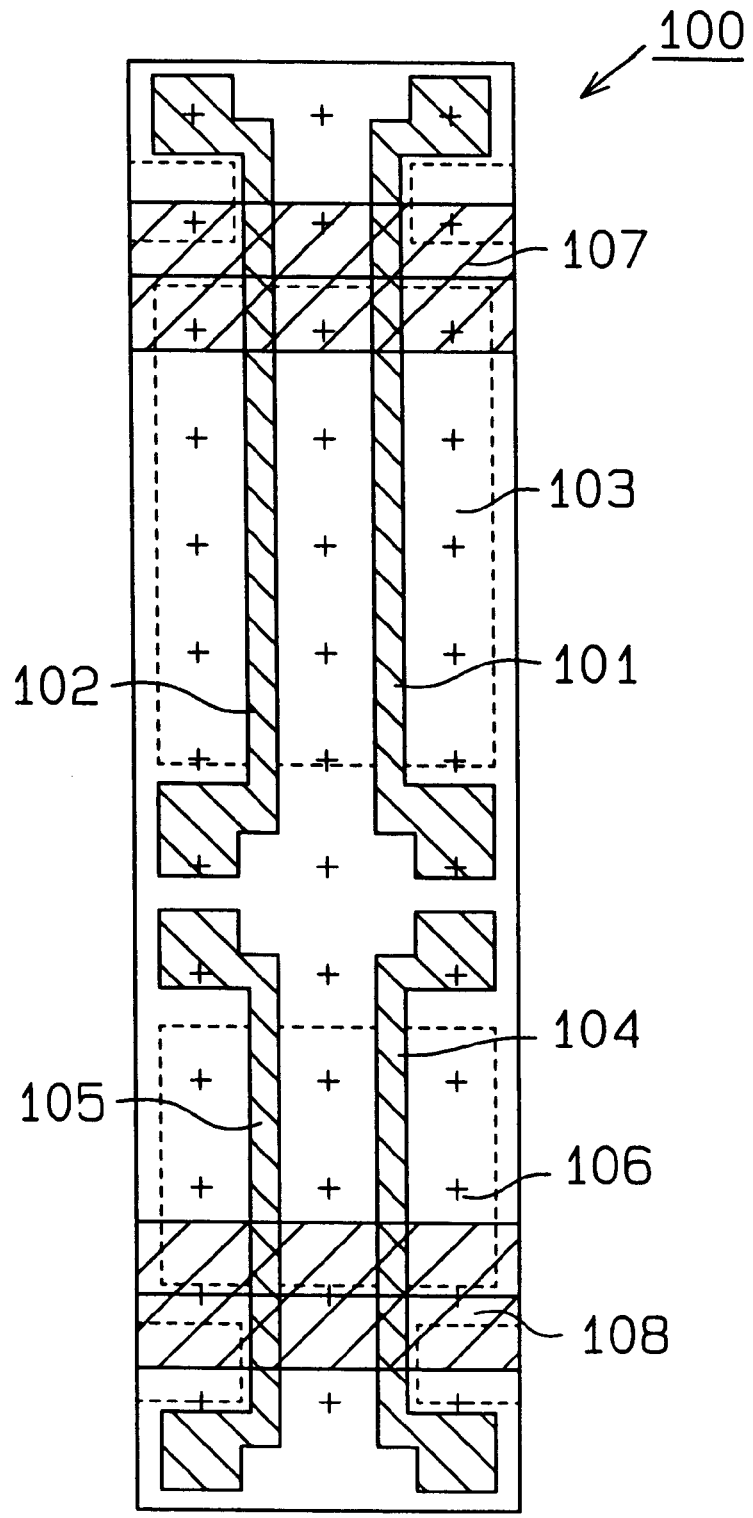
FIG. 16 is a plan view showing the structure of a conventional basic cell.

FIG. 15 is an actual circuit diagram where the adder 80 shown in FIG. 14 is constructed using the basic cells 1 shown in FIG. 1, which shows the interconnection portions by the thick solid lines. The lines that connect the individual transistors are formed on the first metal interconnection layer. The mark "■" indicates a contact portion. This adder 80 is constructed by using three basic cells 1 horizontally laid out in a mirror arrangement.

It should be apparent to those skilled in the art that the present invention may be embodied in many other specific forms without departing from the spirit or scope of the invention. Particularly, it should be understood that the invention may be embodied in the following forms.

Therefore, the present examples and embodiments are to be considered as illustrative and not restrictive and the invention is not to be limited to the details given herein, but may be modified within the scope and equivalence of the appended claims.

What is claimed is:

1. A basic cell having a plurality of transistors separated by a predetermined distance for forming at least a part of an electronic circuit having a predetermined function by coupling the transistors, the transistors of the basic cell comprising;

a first transistor;

a second transistor, the second transistor being different in size and orientation from the first transistor;

a first additional transistor located adjacent to the first transistor and being different in conductive type from the first transistor; and a second additional transistor located adjacent to the second transistor and being different in conductive type from the second transistor.

2. The basic cell according to claim 1, wherein each of the first and second transistors has source/drain regions and an elongated gate electrode, and the gate electrodes of the first and second transistors are different from one another in at least one of their widths and their lengths to differentiate the sizes of the first and second transistors.

3. The basic cell according to claim 2, wherein the second transistor is identical to the first transistor in conductive types.

4. The basic cell according to claim 2, wherein the gate electrode of the first transistor extends in a transverse direction of the basic cell and the gate electrode of the second transistor extends in a longitudinal direction of the basic cell.

5. The basic cell according to claim 1, wherein each of the second transistor and additional transistors has source/drain regions and an elongated gate electrode, and the gate electrodes of the second and additional transistors are different in one of their widths and their lengths from each other to differentiate the sizes of the second and additional transistors.

6. The basic cell according to claim 1, wherein the basic cell is formed on a substrate and the substrate includes first and second metal wiring layers electrically isolated from each other, and wherein a first power source line is formed in the first metal wiring layer and a second power source line is formed in the second metal wiring layer.

7. The basic cell according to claim 1, wherein the basic cell is formed on a substrate that includes a wiring pattern area for coupling the plurality of transistors.

8. The basic cell of claim 1, wherein the second transistor has a gate electrode commonly used for the second additional transistor.

9. A basic cell having a plurality of transistors separated by a predetermined distance for forming an electronic circuit having a predetermined function by coupling the transistors, the transistors of the basic cell comprising:
 a first transistor;
 a second transistor different in size and orientation from the first transistor; and
 a first additional transistor located adjacent to the first transistor and being different in conductive type from the first transistor, wherein each of the first and additional transistors has source/drain regions and an elongated gate electrode, and the gate electrodes of the first and additional transistors are different in one of their widths and their lengths from each other to differentiate the sizes of the first and additional transistors.

10. The basic cell according to claim 9, wherein the first transistor includes:
 three P-type source/drain regions; and
 a pair of parallel first and second gate electrodes located between two adjacent P-type source/drain regions of the three P-type source/drain regions.

11. The basic cell according to claim 10, wherein the additional transistor includes:
 three N-type source/drain regions; and
 a pair of parallel first and second gate electrodes located between two adjacent N-type source/drain regions of the three N-type source/drain regions.

12. The basic cell according to claim 11,
 wherein the first gate electrode of the first transistor is coupled to the first gate electrode of the additional transistor and the first gate electrodes are located on a first line, and
 wherein the second gate electrode of the first transistor is coupled to the second gate electrode of the additional transistor, and the second gate electrodes are located on a second line that extends parallel to the first line.

13. The basic cell according to claim 9, wherein the gate electrodes of the first and the additional transistors are common.

14. The basic cell according to claim 13, wherein the gate electrodes extend along a transverse direction of the basic cell.

15. The basic cell according to claim 9, wherein the gate electrode has an elongate portion having a constant width and a contact having a predetermined width greater than the constant width of the elongate portion, the contact being located at a point midway of the elongate portion and an end of the elongate portion.

16. The basic cell according to claim 9, wherein the basic cell is formed on a substrate that has a first power source line extending in a transverse direction of the basic cell and a second power source line extending in a longitudinal direction of the basic cell.

17. The basic cell of claim 9, wherein the first transistor is P type transistor and the first additional transistor is N type transistor, and wherein the size of the first transistor is greater than that of the first additional transistor.

18. A basic cell having a plurality of transistors separated by a predetermined distance for forming at least a part of an electronic circuit having a predetermined function by coupling the transistors, the transistors of the basic cell comprising;
 a first transistor;
 a second transistor different in size and orientation from the first transistor; and
 third and fourth transistors, wherein the third transistor includes:
  three P-type source/drain regions; and
  a pair of parallel first and second gate electrodes located between two adjacent P-type source/drain regions of the three P-type source/drain regions; and
 wherein the fourth transistor includes:
  three N-type source/drain regions; and
  a pair of parallel first and second gate electrodes located between two adjacent N-type source/drain regions of the three N-type source/drain regions.

19. The basic cell according to claim 18,
 wherein the first gate electrode of the third transistor is coupled to the second gate electrode of the fourth transistor,
 wherein the second gate electrode of the third transistor is coupled to the first gate electrode of the fourth transistor,
 wherein the first gate electrode of the third transistor and the first gate electrode of the fourth transistor are located substantially on a first common line, and
 wherein the second gate electrode of the third transistor and the second gate electrode of the fourth transistor are located on a second common line.

20. A basic cell, for an integrated circuit, formed on a substrate, the basic cell comprising:
 a first device region having a first P type transistor group and a first N type transistor group, wherein the first P and N type transistor groups have a first and a second gate electrode which extend parallel to each other in a first direction, the first P type transistor group has first, second and third P type source/drain regions which are separated from each other by the first and second gate electrodes, and the first N type transistor group has first, second and third N type source/drain regions which are separated from each other by the first and second gate electrodes;
 a second device region having a second P type transistor group and a second N type transistor group, wherein the second P and N type transistor groups have a third, a fourth and a fifth gate electrode which extend parallel to each other in a second direction, which is generally perpendicular to the first direction, the second P type transistor group has fourth, fifth, sixth and seventh P type source/drain regions which are separated from each other by the third, fourth and fifth gate electrodes, and the second N type transistor group has fourth, fifth, sixth and seventh N type source/drain regions which are separated from each other by the third, fourth and fifth gate electrodes;
 a third device region having a third P type transistor group and a third N type transistor group formed by sixth, seventh and eighth gate electrodes, eighth, ninth and tenth P type source/drain regions, eighth, ninth and tenth N type source/drain regions, eleventh and twelfth P type source/drain regions, and eleventh and twelfth N type source/drain regions, wherein the sixth and seventh gate electrodes are generally hook shaped and the eighth gate electrode includes at least one straight section connected to the seventh gate electrode by a connecting section; and an interconnection pattern located between at least two of the first, second and third device regions for facilitating connection of the transistors in the first, second and third device regions, wherein the sizes of the transistors in the first, second and third device regions are different from one another.

21. The basic cell of claim 20, wherein the first device region occupies about one-third of the substrate.

22. The basic cell of claim 21, wherein the second device region occupies about one-fourth of the substrate.

23. The basic cell of claim 22, wherein the third device region occupies about one-third of the substrate.

24. The basic cell of claim 20, wherein the first and second gate electrodes of the first device region include wide, contact parts near a center portion.

25. The basic cell of claim 24, wherein the third, fourth and fifth gate electrodes of the second device region include wide, contact parts.

26. The basic cell of claim 25, wherein the sixth, seventh and eighth gate electrodes of the third device region include wide, contact parts.

27. The basic cell of claim 20, wherein a ratio of a width (W1) of the first to third P type source/drain regions, a width (W2) of the fourth to seventh P type source/drain regions, and a width (W3) of the eighth to twelfth P type source/drain regions (W1:W2:W3) is about 6:3:2.

28. The basic cell of claim 27, wherein a ratio of a width (W4) of the first to third N type source/drain regions, a width (W5) of the fourth to seventh N type source/drain regions, and a width (W6) of the eighth to twelfth N type source/drain regions (W4:W5:W6) is about 10:4:3.

29. The basic cell of claim 20, wherein the interconnection pattern is formed of tungsten polycide.

30. The basic cell of claim 20, wherein the first and second gate electrodes are formed of polysilicon.

31. The basic cell of claim 20, wherein a plurality of the basic cells are arranged in a matrix form on the substrate with adjoining basic cells being in a mirror arrangement.

32. A basic cell having a plurality of transistors separated by a predetermined distance for forming at least a part of an electronic circuit having a predetermined function by coupling the transistors, the transistors of the basic cell comprising:

a first transistor and a second transistor, wherein the first transistor includes:
three P-type source/drain regions; and
a pair of parallel first and second gate electrodes located between two adjacent P-type source/drain regions of the three P-type source/drain regions;
wherein the second transistor includes:
three N-type source/drain regions; and
a pair of parallel first and second gate electrodes located between two adjacent N-type source/drain regions of the three N-type source/drain regions;
wherein the first gate electrode of the first transistor is connected to the second gate electrode of the second transistor;
wherein the second gate electrode of the first transistor is connected to the first gate electrode of the second transistor;
wherein the first gate electrode of the first transistor is located substantially in line with the first gate electrode of the second transistor; and
wherein the second gate electrode of the first transistor is located substantially in line with the second gate electrode of the second transistor.

* * * * *